(12) United States Patent
Huang et al.

(10) Patent No.: US 8,925,622 B2
(45) Date of Patent: Jan. 6, 2015

(54) COOLING PLATE

(75) Inventors: Shiezen Steven Huang, Redondo Beach, CA (US); Jhao-Lung Zeng, Taipei City (TW)

(73) Assignee: ADPV Technology Limited, Apia (WS)

( * ) Notice: Subject to any disclaimer, the term of this patent is extended or adjusted under 35 U.S.C. 154(b) by 365 days.

(21) Appl. No.: 13/462,550

(22) Filed: May 2, 2012

(65) Prior Publication Data

US 2013/0240189 A1    Sep. 19, 2013

(30) Foreign Application Priority Data

Mar. 15, 2012   (TW) ............................. 101108902 A (51) Int. Cl.
*F28F 3/14* (2006.01)
*H05K 7/20* (2006.01)

(52) U.S. Cl.
USPC ........................................... 165/70; 165/168

(58) Field of Classification Search
CPC ............ F28F 2250/04; F28F 2009/224; F28F 2009/222; F28F 9/0278; F28F 9/0202; H05K 7/20145; H05K 7/20272; H01L 23/467
USPC ............... 165/104.33, 104.34, 132, 168, 908; 361/692, 693
See application file for complete search history.

(56) References Cited

U.S. PATENT DOCUMENTS

| 3,909,118 | A  | * | 9/1975  | Schmidt .................... 359/845 |
| 5,361,188 | A  | * | 11/1994 | Kondou et al. ............ 361/695 |
| 6,597,571 | B2 | * | 7/2003  | Kubota et al. ............. 361/695 |
| 7,233,493 | B2 | * | 6/2007  | Wang et al. ................ 361/695 |
| 2001/0017202 | A1 | * | 8/2001 | Mitsumoto et al. ........ 165/174 |
| 2007/0017662 | A1 | * | 1/2007 | Valenzuela ................. 165/170 |
| 2009/0288807 | A1 | * | 11/2009 | Yang et al. ................ 165/80.3 |

* cited by examiner

*Primary Examiner* — Tho V Duong
(74) *Attorney, Agent, or Firm* — Muncy, Geissler, Olds & Lowe, P.C.

(57) ABSTRACT

A cooling plate includes a casing being internally divided into an upper chamber and a lower chamber; an air inlet deposited on at least one lateral wall of the casing enclosing the upper chamber; a plurality of through holes being formed on the partition board and such arranged that the through holes closer to the air inlet are smaller in diameter and the through holes farther from the air inlet are larger in diameter, wherein the upper chamber and the lower chamber are communicated to each other via the through holes; and a plurality of air outlets provided on a lower board below the lower chamber for communicating the lower chamber to an exterior of the casing, wherein the air outlets are identical in diameter and arranged into a matrix-like pattern.

8 Claims, 10 Drawing Sheets

COOLING PLATE

BACKGROUND OF THE INVENTION

1. Technical Field

The present invention relates to cooling technologies, and more particularly, to a cooling plate for cooling articles in a board-like shape.

2. Description of Related Art

An existing photovoltaic device typically has a glass substrate deposited thereon a Mo layer, in which a light absorption layer (e.g. a CIGS layer or a CIS layer) is formed. In the course of forming the light absorption layer, the assembly has to be first heated to a temperature higher than 500° C. before sputtering, evaporation, electroplating or ink-jet is conducted to deposit the light-absorbing material on the Mo layer.

After the light absorption layer is made as described previously, the resulting photovoltaic device needs to be cooled for subsequent or additional processing. Since the glass substrate in the photovoltaic device tends to deform or break when the temperature difference between its upper and lower surfaces is greater than 150° C. or when the temperature difference between different regions in the same surface is greater than 25° C., the cooling cannot be performed naturally in the ambient temperature but requires a specially designed cooling means that is able to cool the glass substrate promptly and evenly, thereby facilitating subsequent or additional processing.

Figure 11:
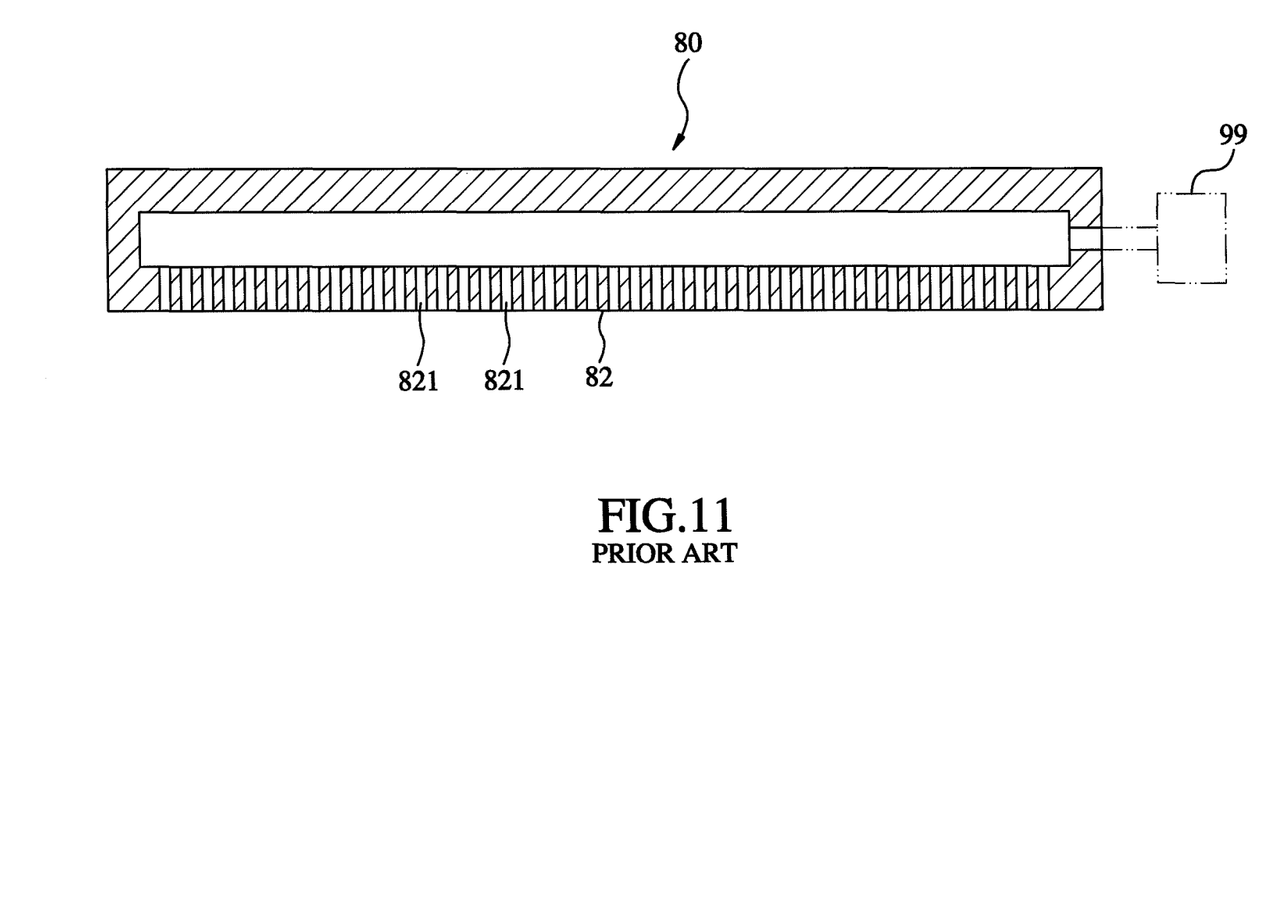
FIG. 11 is a cross-sectional view of a conventional cooling plate.

A known cooling means for such purpose is a cooling plate that delivers cool gas to the glass substrate. As depicted in FIG. 11, a conventional cooling plate 80 has its one side communicated to a gas source 99 that supplies a cooling gas, and distributes the gas to air outlets 821 formed on its lower board 82, so as to cool the glass substrate placed therebeneath. However, since the gas source 99 is provided unilaterally, the air outlets 821 near the gas source 99 present greater gas output due to the higher gas pressure as compared to those farther from the gas source 99. This renders the entire cooling plate 80 having an uneven distribution of gas output, which in turn, causes uneven cooling of the glass substrate. Such uneven cooling may then lead to temperature difference between different regions in the same surface in excess of 25° C. that is responsible for breaking or deformation of the glass substrate. Therefore, the prior art needs to be improved.

SUMMARY OF THE INVENTION

The primary objective of the present invention is to provide a cooling plate that provides even cooling.

Another objective of the present invention is to provide a cooling plate that has controllable gas output on its lower board, so as to achieve uniform gas output across the lower board.

For the foregoing objectives, according to the present invention, a cooling plate comprises a casing being internally divided into an upper chamber and a lower chamber by a partition board, wherein the lower chamber is located below the upper chamber and a bottom wall of the casing that forms a lower boundary of the lower chamber is defined as a lower board; an air inlet deposited on at least one lateral wall of the casing enclosing the upper chamber for allowing an external gas to enter the upper chamber; a plurality of through holes being formed on the partition board and such arranged that the through holes closer to the air inlet are smaller in diameter and the through holes farther from the air inlet are larger in diameter, wherein the upper chamber and the lower chamber are communicated to each other via the through holes; and a plurality of air outlets provided on the lower board for communicating the lower chamber to an exterior of the casing, wherein the air outlets are identical in diameter and arranged into a matrix-like pattern. Thereby the disclosed cooling plate is able to provide uniform gas outputs and, in turn, even cooling.

BRIEF DESCRIPTION OF THE DRAWINGS

The invention as well as a preferred mode of use, further objectives and advantages thereof will be best understood by reference to the following detailed description of illustrative embodiments when read in conjunction with the accompanying drawings, wherein.

DETAILED DESCRIPTION OF THE INVENTION

As shown in FIG. 1 through FIG. 5, according to a first preferred embodiment of the present invention, a cooling plate 10 has a casing 11 that is internally divided into an upper chamber 14 and a lower chamber 16 by a partition board 12. The lower chamber 16 is below the upper chamber 14, and a bottom wall of the casing 11 defining the lower boundary of the lower chamber 16 is herein referred to as a lower board 18.

Figure 5:
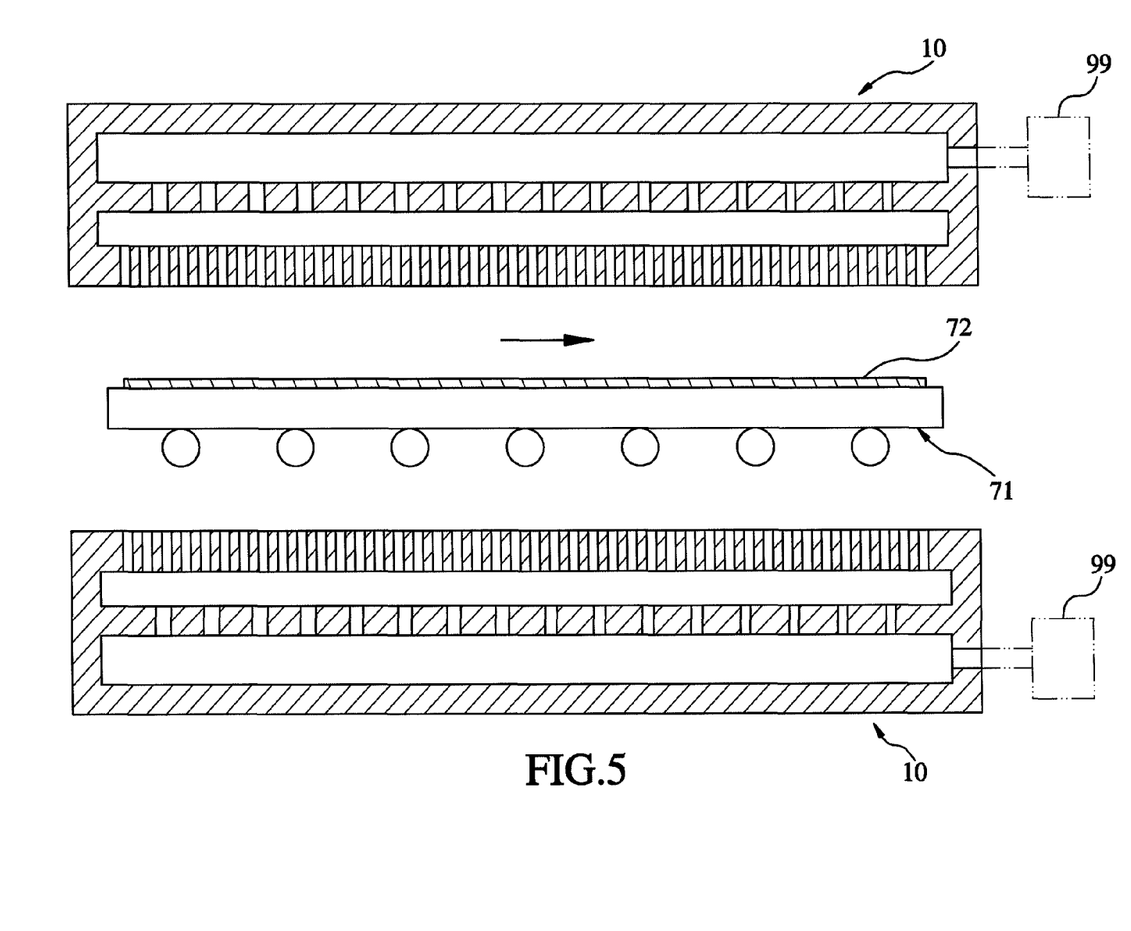
FIG. 5 is an applied view of the cooling plate of the first preferred embodiment.

The upper chamber 14 has at least one lateral wall provided with an air inlet 141 for allowing external air to enter the upper chamber 14. In the present embodiment, the air inlet 141 is connected to an external gas source 99 (as shown in FIG. 5) that supplies a gas.

Figure 4:
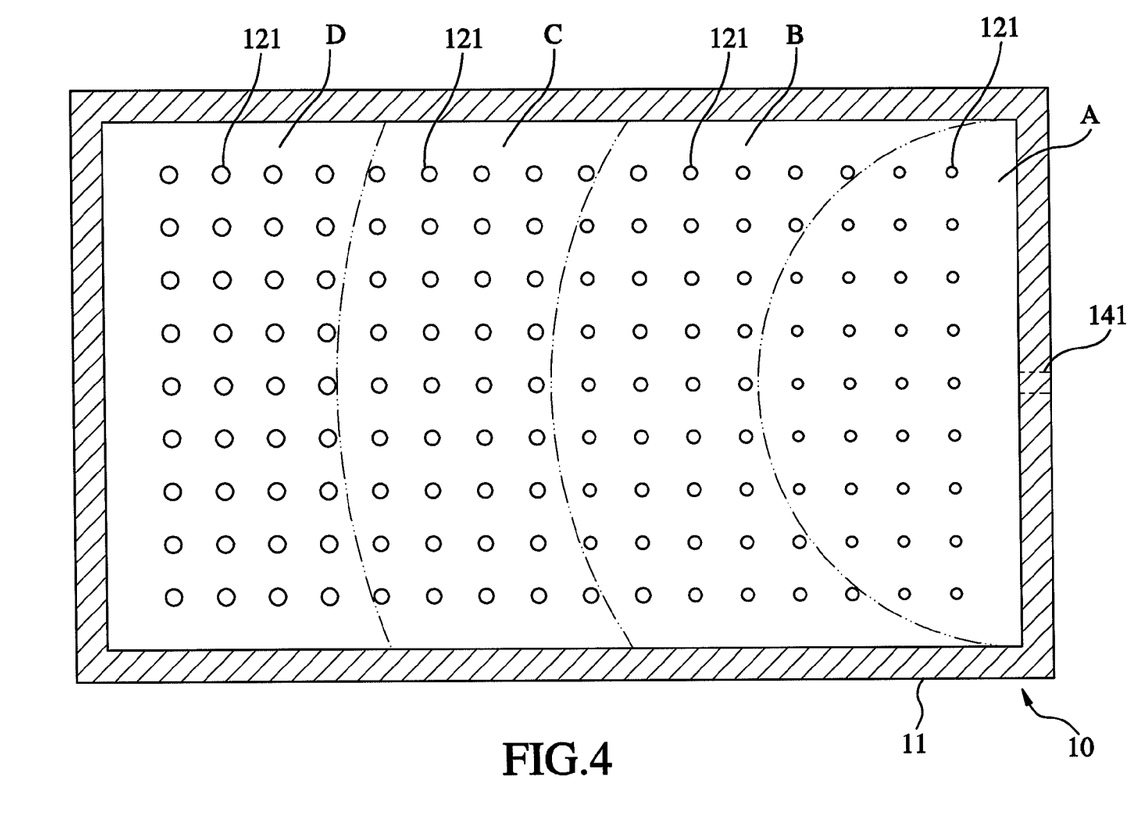
FIG. 4 is another cross-sectional view of the cooling plate taken along LINE 4-4 of FIG. 3, showing arrangement of through holes on a partition board.

The partition board 12 has a plurality of through holes 121. The through holes 121 being closer to the air inlet 141 have smaller diameters, while the through holes 121 being farther from the air inlet 141 have larger diameters. The upper chamber 14 and the lower chamber 16 are communicated to each other via the through holes 121. In the present embodiment, the through holes 121 are grouped into four groups A, B, C and D by diameter. The through holes 121 belonging to the same group have the same diameter, and the through holes 121 belonging to different groups have diameter diameters. Therein, the through holes 121 in Group A have the smallest diameter and the through holes 121 in Group D have the largest diameter. In addition, the through holes 121 are arranged into a matrix-like pattern.

Figure 1:
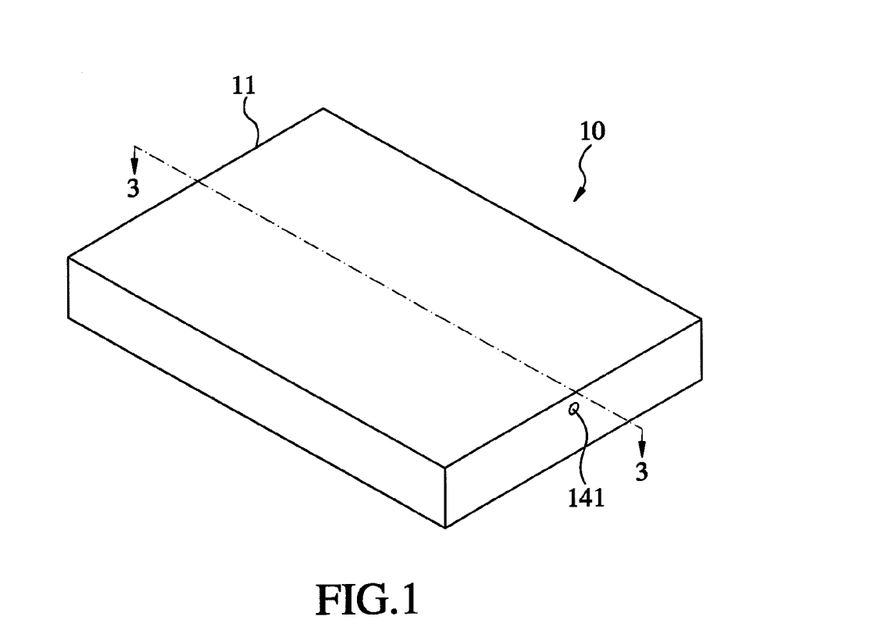
FIG. 1 is a top-down perspective view of a cooling plate according to a first preferred embodiment of the present invention.
Figure 2:
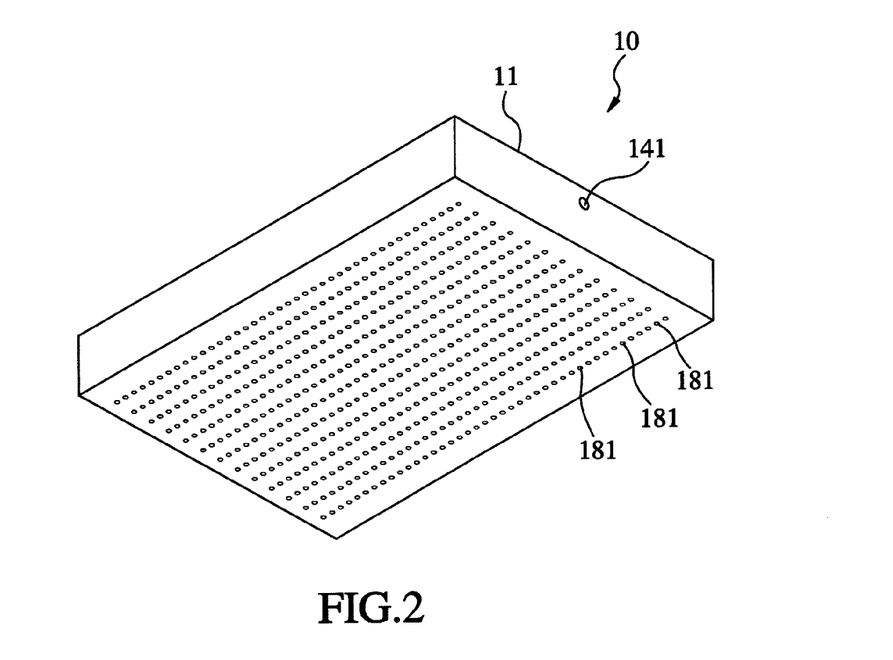
FIG. 2 is a bottom-up perspective view of the cooling plate of the first preferred embodiment.

The lower board 18 is provided with a plurality of air outlets 181 by which the lower chamber 16 is communicated with the exterior. These air outlets 181 have the same diameter and also arranged into a matrix-like pattern.

Figure 3:
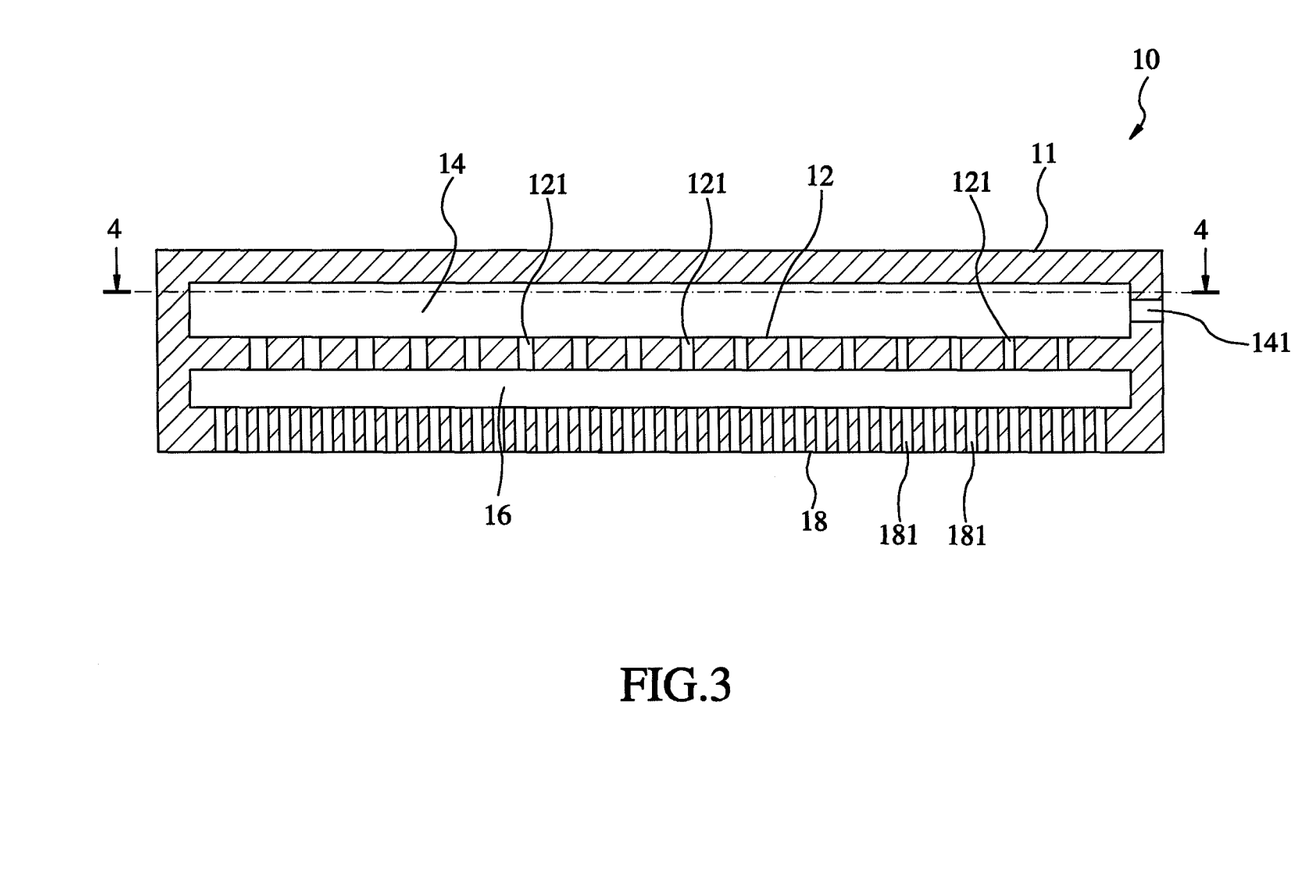
FIG. 3 is a cross-sectional view of the cooling plate taken along LINE 3-3 of FIG. 1.

Thereby, as shown in FIG. 3 and FIG. 4, the gas supplied by the gas source 99 enters the upper chamber 14 through the air inlet 141, then enters the lower chamber 16 via the through holes 121, and is eventually discharged through the air outlets 181 on the lower board 18. The through holes 121 near the air inlet 141 are relatively small in diameter, are under a relatively high gas pressure, and can therefore adjust the gas output to a moderate level. On the other hand, the through holes 121 far from the air inlet 141 are relatively large in diameter, are under a relatively low gas pressure, and can therefore adjust the gas output to a moderate level just as well. In this way, the gas outputs at the air outlets 181 across the lower chamber 16 are equalized. In other words, every point in the lower chamber 16 has approximately the same gas pressure, thereby ensuring the gas outputs at the air outlets 181 from the lower chamber 16 are approximately the same. As a result, the equalized gas outputs can provide cooling evenly.

In practical use, such a case where a glass substrate that has a light absorption deposited thereon as previously discussed is to be cooled, referring to FIG. 5, two said cooling plates 10 may be set to sandwich a substrate conveyer 71 from its top and bottom. Each of the cooling plates 10 is connected to a gas source 99, so that they spout gas evenly to cool the glass substrate 72 from its top and bottom, thereby preventing the glass substrate 72 from deforming or breaking due to uneven cooling.

Figure 6:
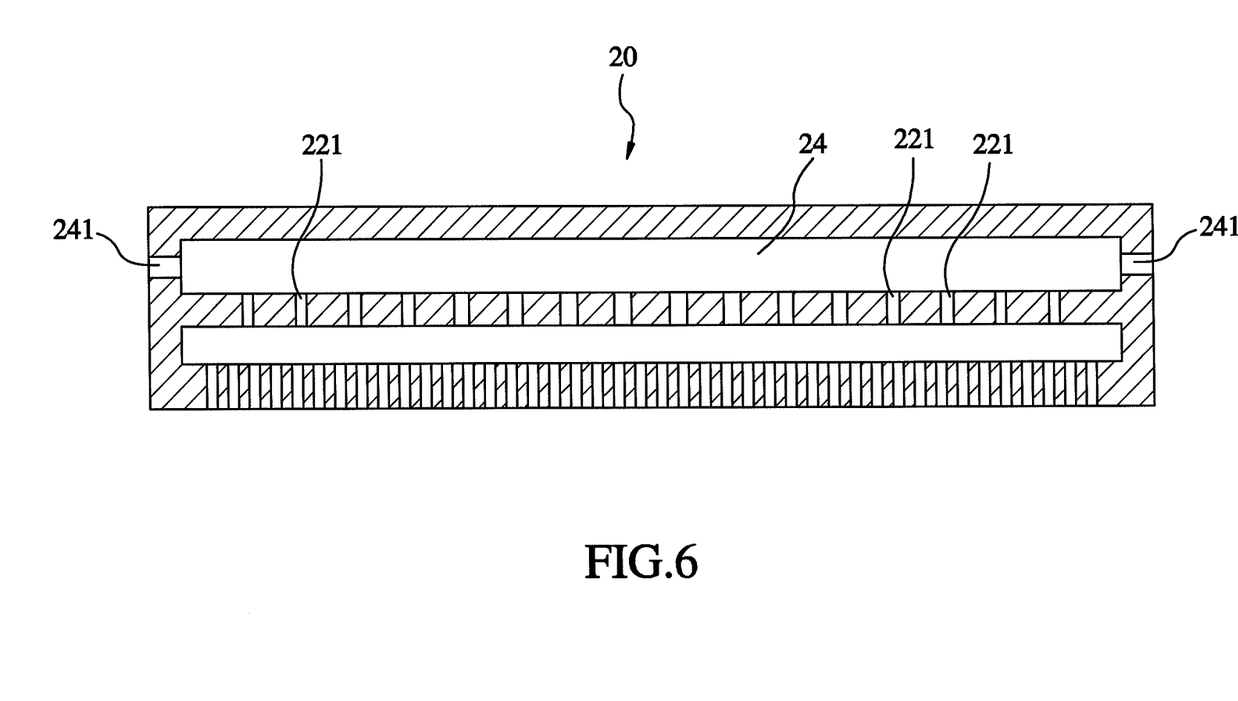
FIG. 6 is a cross-sectional view of a cooling plate according to a second preferred embodiment of the present invention.

Referring to FIG. 6, according to a second preferred embodiment of the present invention, a cooling plate 20 similar to its counterpart as depicted in the first embodiment features that the two opposite lateral walls of the casing defining the upper chamber 24 are each provided with an air inlet 241, so that the two air inlets 241 face each other across the upper chamber 24.

In the present embodiment, the arrangement of the through holes 221 in terms of diameter is different from that of the first embodiment because of the two air inlets 241 that are arranged in a left-right (or front-back) symmetrical layout. Taking the case as shown in FIG. 6 for example, the through holes 221 are such arranged that those at two sides (near the air inlets) have small diameters and those at the center (far from the air inlets) have large diameters.

The rest of the second embodiment is structurally and functionally similar to the first embodiment, and therefore needs not to be discussed in any length herein.

Figure 7:
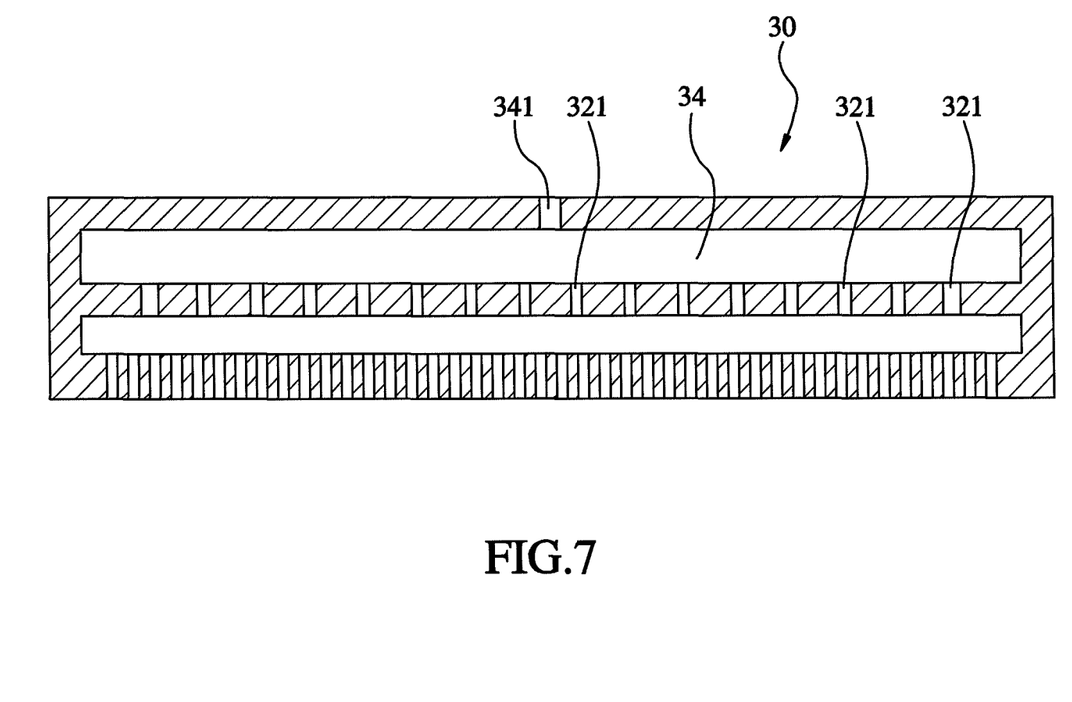
FIG. 7 is a cross-sectional view of a cooling plate according to a third preferred embodiment of the present invention.
Figure 8:
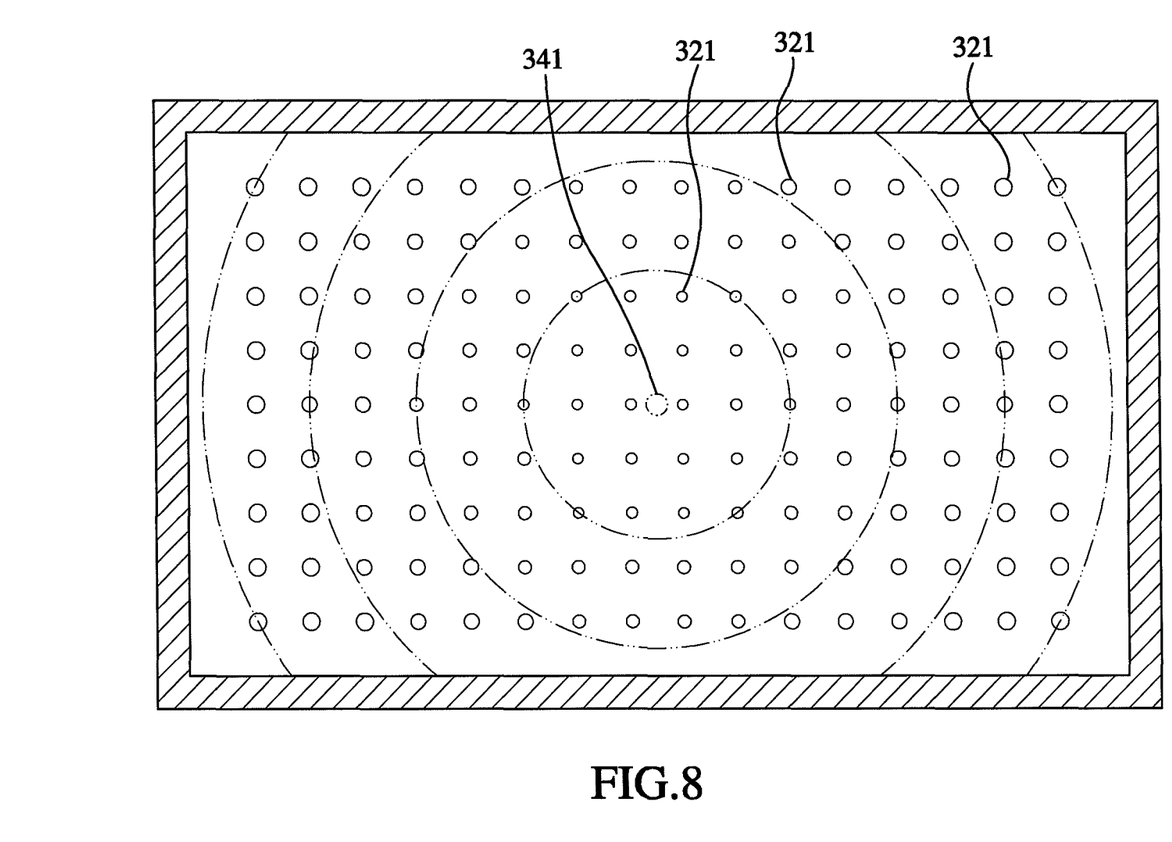
FIG. 8 is a schematic view of the cooling plate of the third preferred embodiment, showing arrangement of through holes on a partition board.

Referring to FIG. 7 and FIG. 8, according to a third preferred embodiment of the present invention, a cooling plate 30 similar to its counterpart as depicted in the first embodiment features that a ceiling of the casing defining the upper chamber 34 from top is centrally provided with an air inlet 341. In the present embodiment, the arrangement of the through holes 321 in terms of diameter is different from that of the first embodiment because of the air inlets 341 that is at the upper center of the upper chamber 34. Taking the case as shown in FIG. 8 for example, the diameters of the through holes 321 gradually increase from the center (near the air inlet) to the periphery (far from the air inlets).

The rest of the third embodiment is structurally and functionally similar to the first embodiment, and therefore needs not to be discussed in any length herein.

Figure 9:
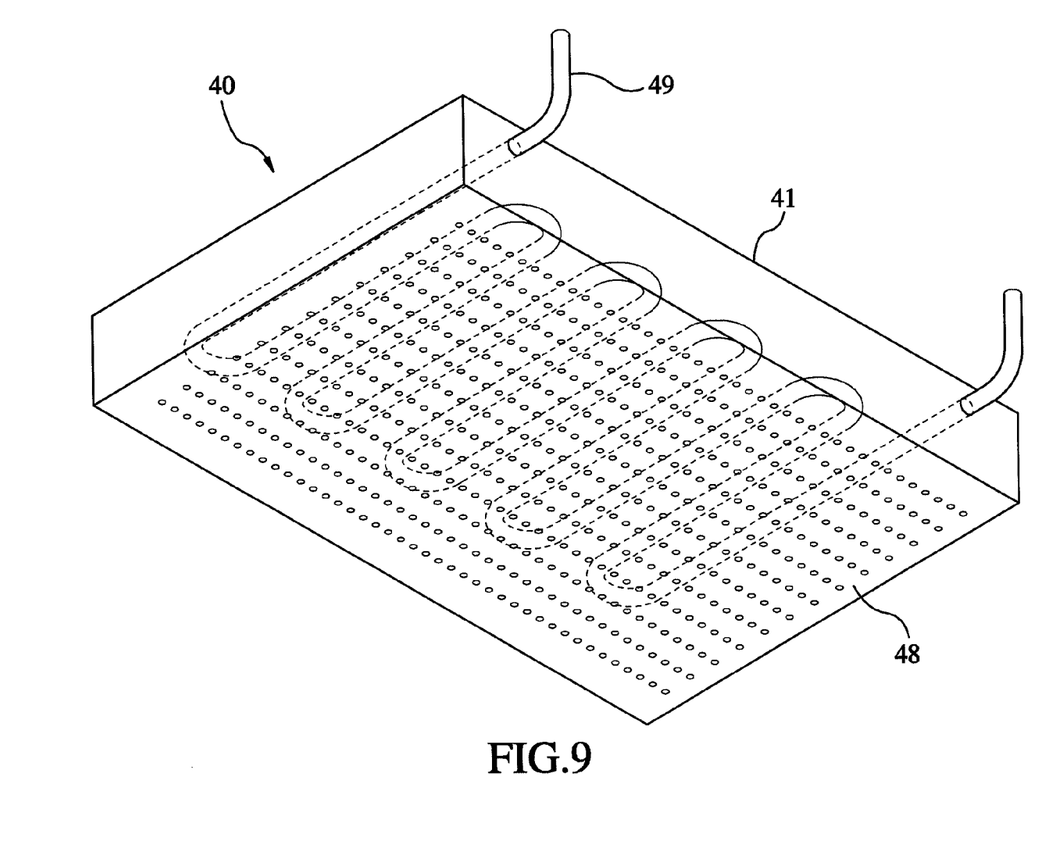
FIG. 9 is a bottom-up perspective view of a cooling plate according to a fourth preferred embodiment of the present invention.
Figure 10:
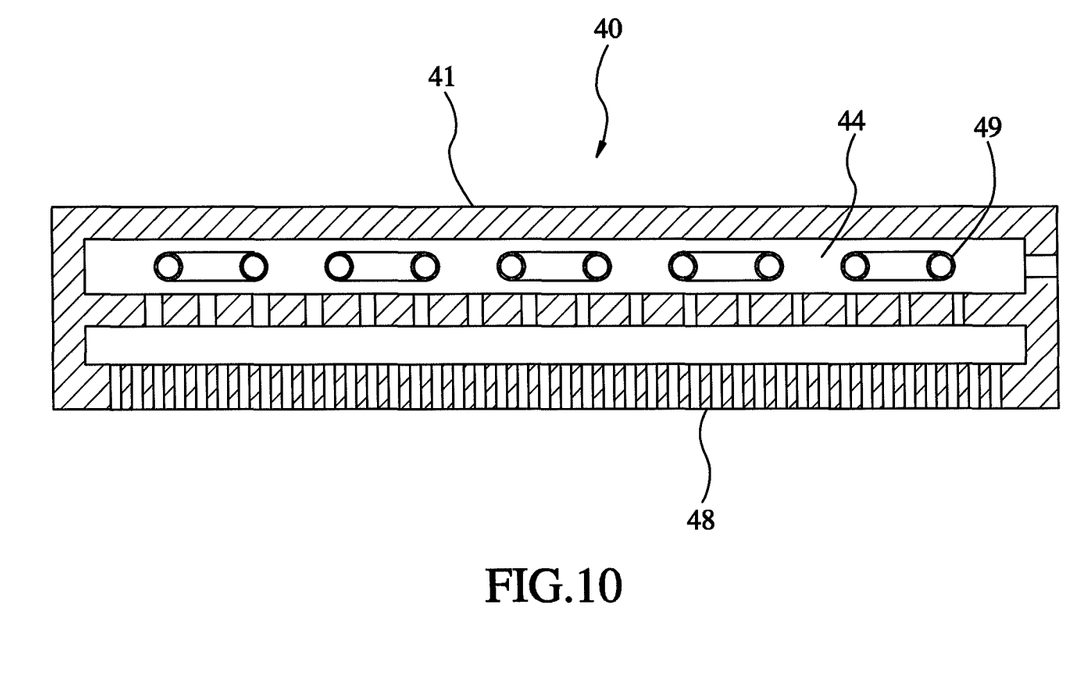
FIG. 10 is a cross-sectional view of the cooling plate of the fourth preferred embodiment.

Referring to FIG. 9 and FIG. 10, according to a fourth preferred embodiment of the present invention, a cooling plate 40, similar to its counterpart as depicted in the first embodiment features that it further has a cooling oil pipe 49. In the present embodiment, the cooling oil pipe 49 is a metallic tube allowing oil to flow and circulate therein. The cooling oil pipe 49 comes from the exterior of the casing 41 and zigzags in the upper chamber 44 before leaving the casing 41. The cooling oil pipe 49 is thus arranged in a continuous S-shape.

In operation, oil fed into the cooling oil pipe 49 circulates and brings away heat from the gas in the upper chamber 44, thereby cooling the gas in the upper chamber 44 and, in turn, allowing the gas spouted by the lower board 48 to be cooler and provide better cooling effect.

The rest of the fourth embodiment is structurally and functionally similar to the first embodiment, and therefore needs not to be discussed in any length herein.

With the foregoing configurations, the present invention has controllable gas output on its lower board, so as to achieve uniform gas output across the lower board and ensure even cooling.

What is claimed is:

1. A cooling plate, comprising:
   a casing being internally divided into an upper chamber and a lower chamber by a partition board, wherein the lower chamber is located below the upper chamber and a bottom wall of the casing that forms a lower boundary of the lower chamber is defined as a lower board;
   an air inlet deposited on at least one lateral wall of the casing enclosing the upper chamber for allowing an external gas to enter the upper chamber;
   a plurality of through holes being formed on the partition board and such arranged that the through holes closer to the air inlet are smaller in diameter and the through holes farther from the air inlet are larger in diameter, wherein the upper chamber and the lower chamber are communicated to each other via the through holes; and
   a plurality of air outlets provided on the lower board for communicating the lower chamber to an exterior of the casing, wherein the air outlets are identical in diameter and arranged into a matrix-like pattern.

2. The cooling plate of claim 1, wherein the through holes are grouped into a plurality groups by diameter, and the through holes in one said group are identical in diameter, while the through holes in different groups are different in diameter.

3. The cooling plate of claim 1, wherein two opposite lateral walls of the casing that define the upper chamber are each provided with an air inlet, so that the two air inlets face each other across the upper chamber.

4. The cooling plate of claim 1, wherein the air inlet is deposited at a center of a ceiling of the casing defining the upper chamber from top instead of being deposited on the at least one lateral wall of the casing.

5. The cooling plate of claim 1, further comprising a cooling oil pipe that comes from an exterior of the casing and zigzags in the upper chamber before leaving the casing.

6. The cooling plate of claim 5, wherein the cooling oil pipe is arranged in a continuous S-shape.

7. The cooling plate of claim 5, wherein the cooling oil pipe is a metallic tube allowing oil to flow and circulate therein.

8. The cooling plate of claim 1, wherein the through holes are arranged into a matrix-like pattern.

* * * * *